United States Patent
Achkir et al.

(10) Patent No.: US 12,057,379 B2
(45) Date of Patent: Aug. 6, 2024

(54) OPTIMIZED POWER DELIVERY FOR MULTI-LAYER SUBSTRATE

(71) Applicant: Cisco Technology, Inc., San Jose, CA (US)

(72) Inventors: D. Brice Achkir, Livermore, CA (US); Shobhana Ram Punjabi, San Jose, CA (US); Jie Xue, Dublin, CA (US)

(73) Assignee: CISCO TECHNOLOGY, INC., San Jose, CA (US)

(*) Notice: Subject to any disclaimer, the term of this patent is extended or adjusted under 35 U.S.C. 154(b) by 208 days.

(21) Appl. No.: 17/702,892

(22) Filed: Mar. 24, 2022

(65) Prior Publication Data

US 2023/0071476 A1    Mar. 9, 2023

Related U.S. Application Data

(60) Provisional application No. 63/240,620, filed on Sep. 3, 2021.

(51) Int. Cl.
    *H01L 23/498* (2006.01)
(52) U.S. Cl.
    CPC .. *H01L 23/49805* (2013.01); *H01L 23/49822* (2013.01); *H01L 23/49838* (2013.01)
(58) Field of Classification Search
    CPC ......... H01L 23/49805; H01L 23/49822; H01L 23/49848
    USPC ......................................................... 361/142
    See application file for complete search history.

(56) References Cited

U.S. PATENT DOCUMENTS

| | | | | |
|---|---|---|---|---|
| 5,561,593 A | * | 10/1996 | Rotolante | ......... H01L 23/49827 257/E25.013 |
| 5,895,230 A | * | 4/1999 | Bartley | ............... H01L 23/5382 257/E23.079 |
| 6,388,207 B1 | | 5/2002 | Figueroa et al. | |
| 6,390,827 B1 | * | 5/2002 | Howell | .............. H01R 12/7088 439/70 |

(Continued)

FOREIGN PATENT DOCUMENTS

EP         3133735 A1    2/2017

OTHER PUBLICATIONS

International Search Report and Written Opinion in counterpart International Application No. PCT/US2022/041645, mailed Dec. 20, 2022, 14 pages.

(Continued)

*Primary Examiner* — Timothy J Thompson
*Assistant Examiner* — Michael F McAllister
(74) *Attorney, Agent, or Firm* — Edell, Shapiro & Finnan, LLC

(57) ABSTRACT

A multi-layer substrate stacking a plurality of insulating substrates supports one or more devices. Each substrate includes a face supporting conductive traces and edges surrounding the face at a substantially perpendicular angle. The multi-layer substrate includes a ground plane on a first substrate and a power plane on a second substrate. The ground plane is connected to at least one ground pad disposed on a first edge of the first substrate, which provides a low inductance ground path to the ground plane. The power plane is connected to at least one power pad disposed on a second edge of the second substrate, which provides a low inductance power path to the power plane.

20 Claims, 6 Drawing Sheets

(56) References Cited

U.S. PATENT DOCUMENTS

| | | | | |
|---|---|---|---|---|
| 6,558,169 B2* | 5/2003 | Figueroa | | H05K 7/1092 |
| | | | | 257/E23.079 |
| 6,680,526 B2* | 1/2004 | Figueroa | | H01L 23/50 |
| | | | | 257/E23.079 |
| 7,309,912 B1* | 12/2007 | Shi | | H01L 23/50 |
| | | | | 257/E23.079 |
| 7,791,173 B2* | 9/2010 | Park | | H01L 24/13 |
| | | | | 257/773 |
| 7,928,549 B2* | 4/2011 | Chen | | H01L 25/0657 |
| | | | | 257/777 |
| 7,944,707 B2* | 5/2011 | Hung | | H01L 23/5383 |
| | | | | 361/762 |
| 8,189,342 B2* | 5/2012 | Bang | | H05K 3/403 |
| | | | | 361/788 |
| 8,299,592 B2* | 10/2012 | Suh | | H01L 24/17 |
| | | | | 257/276 |
| 9,433,090 B2 | 8/2016 | Atkinson et al. | | |
| 9,583,426 B2* | 2/2017 | Shen | | H01L 23/49838 |
| 9,691,694 B2* | 6/2017 | Jow | | H01L 23/49811 |
| 11,096,277 B2 | 8/2021 | Del Rosal et al. | | |
| 11,158,568 B2* | 10/2021 | Ong | | H01L 23/49838 |
| 2002/0131252 A1* | 9/2002 | Hall | | H01R 12/52 |
| | | | | 361/760 |
| 2002/0142628 A1* | 10/2002 | Figueroa | | H01L 23/50 |
| | | | | 257/E23.079 |
| 2003/0003705 A1* | 1/2003 | Chung | | H01L 23/49822 |
| | | | | 438/612 |
| 2003/0085055 A1* | 5/2003 | Skinner | | H01L 23/552 |
| | | | | 257/E23.079 |
| 2003/0197259 A1* | 10/2003 | Figueroa | | H01L 23/49805 |
| | | | | 257/E23.079 |
| 2004/0057253 A1* | 3/2004 | DeCusatis | | G02B 6/425 |
| | | | | 362/581 |
| 2004/0075165 A1* | 4/2004 | Frutschy | | H01L 23/50 |
| | | | | 257/E23.079 |
| 2004/0228100 A1 | 11/2004 | Wright | | |
| 2005/0051889 A1* | 3/2005 | Wood | | H01L 25/18 |
| | | | | 257/E23.079 |
| 2005/0051906 A1* | 3/2005 | He | | H01L 23/49805 |
| | | | | 257/E23.07 |
| 2005/0145885 A1* | 7/2005 | He | | H01L 23/07 |
| | | | | 257/E23.07 |
| 2005/0280138 A1* | 12/2005 | Shrivastava | | H01L 23/50 |
| | | | | 257/E23.079 |
| 2006/0055022 A1 | 3/2006 | Nelson et al. | | |
| 2008/0218090 A1 | 9/2008 | Yoo et al. | | |
| 2013/0161811 A1* | 6/2013 | Yang | | H01L 23/48 |
| | | | | 257/737 |
| 2015/0282317 A1 | 10/2015 | Gonya et al. | | |
| 2017/0125331 A1* | 5/2017 | Shen | | H01L 23/49805 |
| 2018/0040544 A1 | 2/2018 | Katkar et al. | | |
| 2019/0244883 A1* | 8/2019 | Ong | | H05K 3/3405 |
| 2019/0326327 A1 | 10/2019 | Lin et al. | | |
| 2019/0393141 A1* | 12/2019 | Cheah | | H01L 23/552 |
| 2021/0280566 A1 | 9/2021 | Pothukuchi et al. | | |

OTHER PUBLICATIONS

IPC, "Generic Standard on Printed Board Design," IPC-2221A, https://www.ipc.org/TOC/IPC-2221A.pdf, May 2003, 124 pages.

MADPCB, "Edge Plating," https://madpcb.com/edge-plating/, Sep. 2021, 6 pages.

PCBWay, "Why Some PCBs Need Edge Plating?," Blog, https://www.pcbway.com/blog/technology/Why_Some_PCBs_Need_Edge_Plating_.html, Dec. 2020, 8 pages.

Yu, et al., "Allocating Power Ground Vias in 3D ICs for Simultaneous Power and Thermal Integrity," ACM Transactions on Design Automation of Electronic Systems, May 2009, 31 pages.

* cited by examiner

OPTIMIZED POWER DELIVERY FOR MULTI-LAYER SUBSTRATE

CROSS REFERENCE TO RELATED APPLICATION

This application claims priority to U.S. Provisional Application No. 63/240,620, filed Sep. 3, 2021, the entirety of which is incorporated herein by reference.

TECHNICAL FIELD

The present disclosure relates to power delivery to electronic packages.

BACKGROUND

Packaged electronics and optoelectronics are typically mounted on substrates such as Printed Circuit Boards (PCBs) fabricated with conductive traces, vias, and planes to carry electric power and/or signals between components. Multi-layer substrates provide support for multiple layers of conductive elements enabling more complex circuitry and components. Multi-layer substrates may include a plurality of contacts (e.g., a Ball Grid Array (BGA)) on the bottom face that provide signals and power to the components packaged with the multi-layer substrate.

DESCRIPTION OF EXAMPLE EMBODIMENTS

Overview

An apparatus is provided comprising a plurality of insulating substrates stacked into a multi-layer substrate. Each substrate comprises a face supporting conductive traces and edges surrounding the face at a substantially perpendicular angle. The apparatus includes a ground plane on a first substrate of the plurality of insulating substrates. The ground plane is connected to at least one ground pad disposed on a first edge of the first substrate. The at least one ground pad provides a low inductance ground path to the ground plane. The apparatus also includes a power plane on a second substrate of the plurality of insulating substrates. The power plane is connected to at least one power pad disposed on a second edge of the second substrate. The at least one power pad provides a low inductance power path to the power plane.

Example Embodiments

High bandwidth optical tiles supporting Co-Packaged Optics (CPO), Near Packaged Optics (NPO), and next generation pluggable modules will see power requirements increasing greatly in comparison to current generation modules. For instance, a typical NPO module may use about 1.5 kW, or about 120 A at 12 V. Increasing power delivery to this level may require pushing the boundaries of high copper density with a large number of power planes and shapes in a multi-layer substrate. Delivering this level of power through vias from the bottom of the multi-layer substrate to the power planes/shapes within the multi-layer substrate or Printed Circuit Board (PCB) presents additional challenges as the amount of power increases.

To optimize the layers of the multi-layer substrate and balance the copper distribution, power planes are typically placed on the middle layers of the multi-layer substrate, leaving the higher and lower layers available for signal routing of a large number of high-speed channels. In a typical multi-layer substrate, a large number of antipads (i.e., voids) in the power planes and ground planes are needed to accommodate a large number of signal lines connecting traces above and below the power/ground planes. The large number of antipads reduces the copper density and overall area of the power/ground plane and contributes to the "Swiss Cheese phenomenon."

Additionally, the size of vias, and the total conductive surface area after plating, limits the current carrying capacity of each individual via (e.g., typically less than 1 A for a 6 mil via with 1 mil plating following the Institute for Printed Circuits (IPC) 2221 standard for current carrying capability of internal conductors).

Numerous vias may be required to accommodate the current needs of high power modules. Further, supplying power through a large number of vias in the bottom face of a multi-layer substrate may present a significant issue with mutual inductance and contributes to the impedance of the power plane, which may violate design parameters and introduce avenues for noise coupling.

Figure 1:
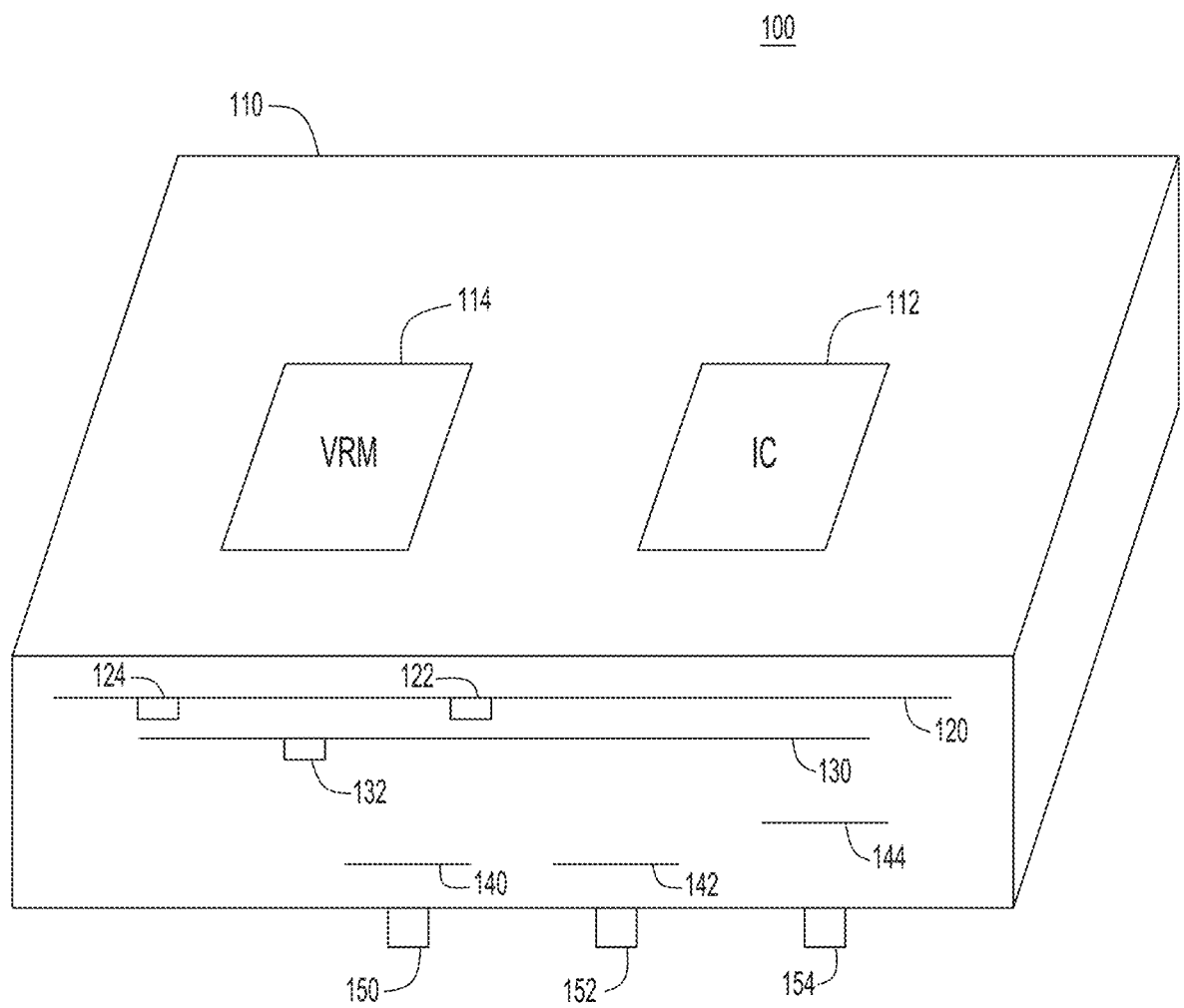
FIG. 1 is simplified block diagram of a multi-layer substrate with edge contacts for power planes, according to an example embodiment.

Referring now to FIG. 1, a simplified diagram illustrates a device 100 that packages chips on a multi-layer substrate 110. The multi-layer substrate 110 supports an Integrated Circuit (IC) 112 and a Voltage Regulation Module (VRM) 114. Within the multi-layer substrate 110 is a ground plane 120 with ground pads 122 and 124 connected to the ground plane 120. The ground plane 120 may cover some or all of an individual layer of the multi-layer substrate 110. In other words, the ground plane 120 may be a full structure covering substantially an entire layer of the multi-layer substrate 110, or the ground plane 120 may be a partial structure with an area that covers a portion of an individual layer. The multi-layer substrate 110 also includes a power plane 130 with a power pad 132 connected to the power plane 130. The power plane 130, which may also be called a power shape 130, is configured to provide a constant voltage level and covers at least a portion of an individual layer of the multi-layer substrate 110.

Typically, a ground plane or power plane describes a conductive structure that covers substantially an entire layer, and a ground shape or power shape describes a conductive structure that covers a smaller portion of an individual layer of a multi-layer substrate. For instance, multiple power shapes may cover different portions of a single layer in a multi-layer substrate. As used herein, the terms plane and shape (i.e., power plane or power shape) may be used interchangeably, and may refer to conductive structures that cover some or all of a layer in a multi-layer substrate.

In another example, the width of the edge pads (e.g., ground pads 122 and 124, or power pad 132) may be increased to increase the amount of current supplied to the respective conductive plane (e.g., ground plane 120 or power plane 130). For instance, the width and placement of the ground pads 122 and 124 may be increased to form a single large ground pad with sufficient current capacity to supply the ground plane 120. Additionally, the plating thickness of the edge pads may be increased to increase the current capacity.

The multi-layer substrate 110 also includes signal traces 140, 142, and 144 on one or more layers of the multi-layer substrate 110. The signal traces 140, 142, and 144 are configured to carry electrical signals through the multi-layer substrate 110. Bottom contacts 150, 152, and 154 are disposed on the bottom face of the multi-layer substrate 110 and may be configured to connect to signal traces 140, 142, 144, power plane 130, and/or ground plane 120 through vias (not shown) that cross individual layers of the multi-layer substrate 110.

In one example, the IC 112 is a communication chip configured for high bandwidth communication. In another example, the VRM 114 may obtain power from the power plane 130 and generate one or more stable voltage sources for the IC 112 or other components on the multi-layer substrate 110.

In a further example, the multi-layer substrate 110 may include more than one power plane 130. Different power planes 130 may be configured to provide the same or different voltage levels in comparison to the voltage of the ground plane. Additionally, one or more power pads 132 may span across power planes 130 with the same voltage level. Similarly, the multi-layer substrate 110 may include more than one ground plane 120. The ground pads 122 and/or 124 may span across ground planes 120 that are disposed on different layers of the multi-layer substrate 110.

Figure 2:
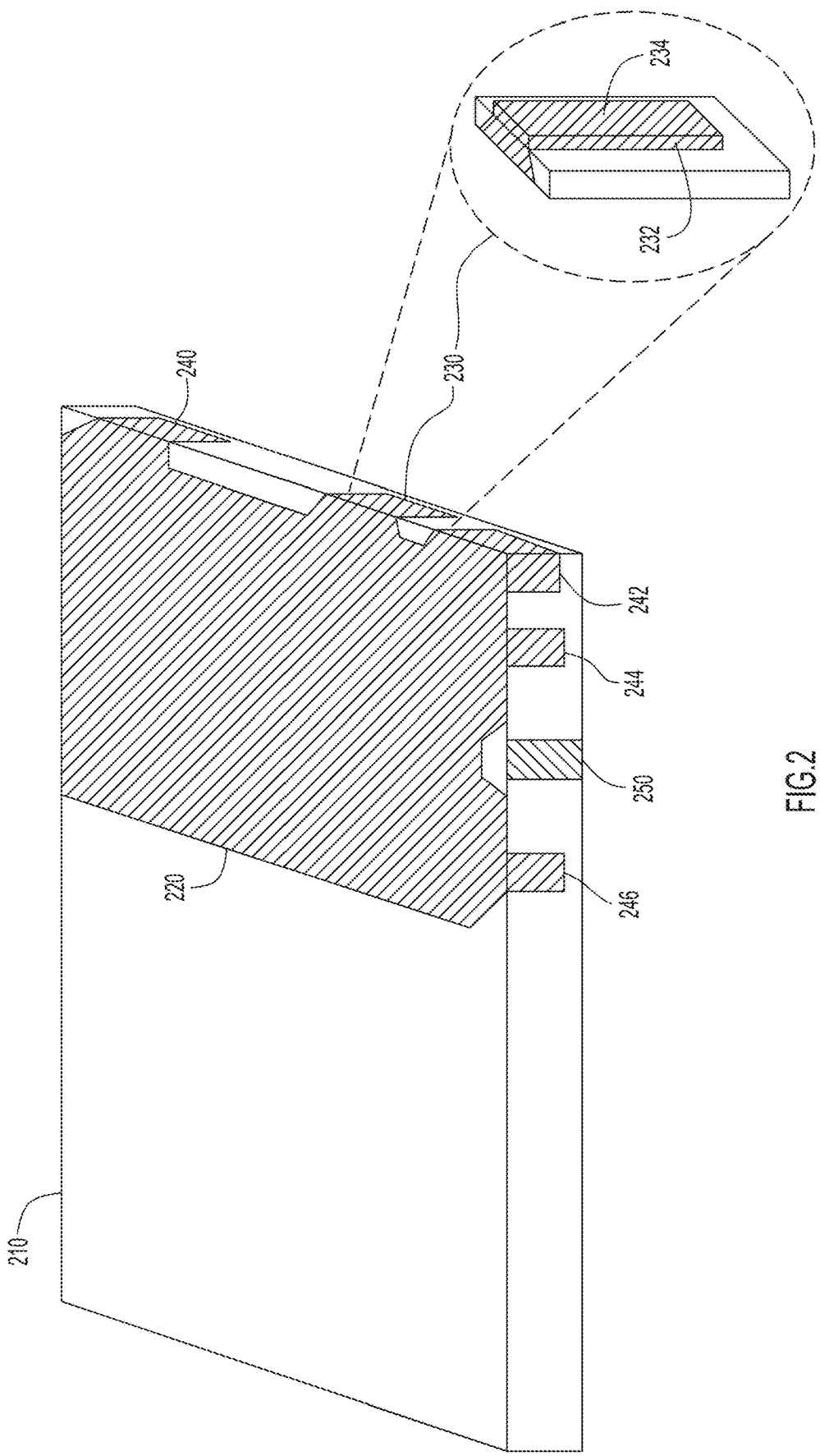
FIG. 2 illustrates one layer of a multi-layer substrate configured with a power/ground plane and edge contacts, according to an example embodiment.

Referring now to FIG. 2, a single layer 210 of the multi-layer substrate 110 is shown to illustrate edge pads providing an electrical contact along the side of the layer 210. A power shape 220 is disposed on the top face of the layer 210 with one or more portion of the power shape 220 extending to the edge of the layer 210. The power shape 220 is electrically connected to an edge pad 230 that is disposed on an edge of the layer 210. As shown in the enlarged portion of FIG. 2, the edge pad 230 may protrude from the edge of the layer 210 and expose a side portion 232 of the edge pad 230. The face portion 234 of the edge pad 230 provides a large contact surface along the edge of the layer 210 to supply an electric potential to the power shape 220. Additional edge pads 240, 242, 244, and 246 also connect to the power shape 220 and provide additional contacts along different edges of the layer 210. The edge pad 250 is positioned in a place that does not contact the power shape 220, and may be used with edge pads of adjacent layers to electrically connect structures on the adjacent layers without electrically connecting to the power shape 220. For instance, the layers above and below the layer 210 may surround the power shape 220 with ground planes, which are connected through the edge pad 250.

In one example, the edge pad 230 may be built by milling the edge of the layer 210 to expose the power shape 220, and plating the edge of the layer 210 using a mask to define the area of the edge pad 230. The edge pads 240, 242, 244, 246, and 250 may be built with a similar technique at the same time as edge pad 230 or at different times. The edge pad 230 provides a significantly higher current carrying capability to the power shape 220 than vias through multi-layer substrate 110. Using the IPC 2221 standard for current carrying capability of external conductors, an edge pad 230 that is 0.020 inches wide and 0.003 inches thick, (i.e., with a 0.060 square inch cross sectional conducting area) will have an estimated maximum current of 4.2 A for a 30° C. rise in temperature. In other words, a single edge pad 230 can provide more current to the power shape 220 than five internal vias through the layer 210. Additionally, the current carrying capacity of the edge pad 230 may be further increased by increasing the width and/or the thickness of the edge pad 230.

In another example, the power shape 220 may be configured as a ground plane. In other words, the power shape 220 may be configured to provide any voltage value, including ground. Additionally, multiple layers similar to layer 210 may be combined in the multi-layer substrate, with different layers 210 supporting power shapes 220 configured for different voltage levels. Further, multiple power shapes 220 may be included on a single layer 210. For instance, two power shapes held at different voltages may be included on a single layer, and may be separated by a ground shape to minimize interference.

Figure 3:
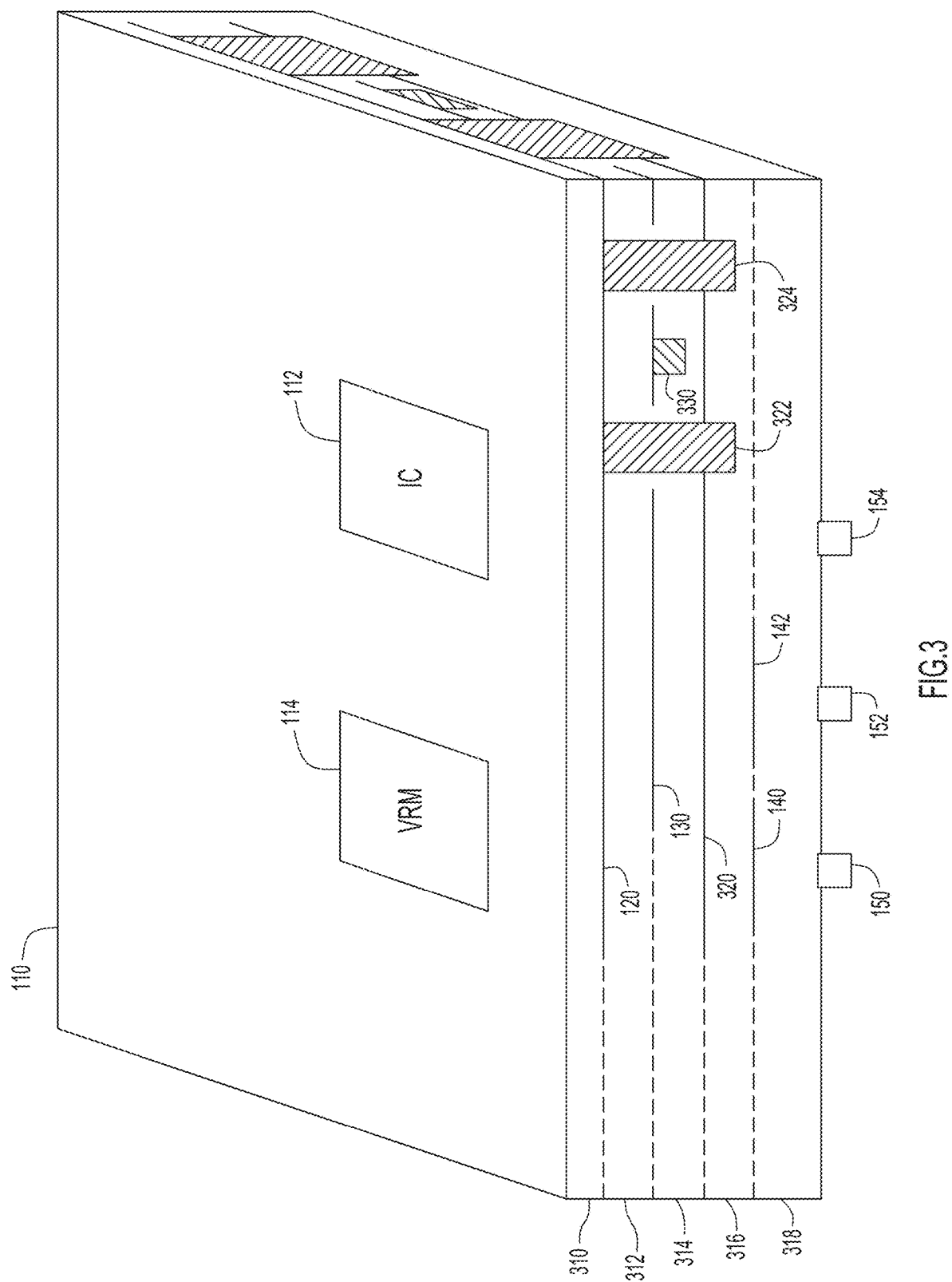
FIG. 3 illustrates an example of a multi-layer substrate with an edge contact for a power plane surrounded by edge contacts for ground planes, according to an example embodiment.

Referring now to FIG. 3, a simplified diagram illustrates a multi-layer substrate 110 that isolates a power plane between ground planes on different layers. The multi-layer substrate 110 includes individual layers 310, 312, 314, 316, and 318. The top layer 310 supports one or more optoelectronics modules or electronics modules, such as IC 112 and VRM 114. The top layer 310 may also support one or more passive devices (e.g., resistors, capacitors, antennae, etc.) or signal traces which are not shown in FIG. 3 for simplicity. The layer 312 below the layer 310 supports a ground plane 120, e.g., to isolate the modules from noise generated in the multi-layer substrate 110. The layer 314 below the layer 312 supports a power shape 130, which may provide power to the modules supported by the multi-layer substrate 110. The layer 316 below the layer 314 supports another ground plane 320, which may serve to surround and isolate noise from the power shape 130 on the layer 314. The bottom layer 318 supports signal traces 140 and 142 and includes bottom contacts 150, 152, and 154 on the bottom face of the bottom layer 318.

Edge pads 322 and 324 span the layers 312, 314, and 316 are electrically connected to both of the ground planes 120 and 320, and electrically isolated from the power plane 130. The power plane 130 is supplied by an edge pad 330 that does not extend beyond the layer 314 supporting the power plane 130. By surrounding the power plane 130 with ground planes 120 and 320, and surrounding the power edge pad 330 with the ground edge pads 322 and 324, the noise generated with supplying power to the modules through the multi-layer substrate is isolated. Additionally, surrounding the power plane 130 with ground planes 120 and 320 and the power edge pad 330 with ground edge pads 322 and 324 isolates the power plane 130 and mitigates coupling from external noise sources. In the example depicted in FIG. 3, the placement and control of the edge pads 322, 324, and 330 to less than then entire edge of the multi-layer substrate 110 enhances the noise isolation of supplying power to the modules on the multi-layer substrate 110. The ground planes 120 and 320 may extend all the way to edge of the layers 312 and 316, respectively, further mitigating any noise coupling with the power plane 130.

Each individual layer 310, 312, 314, 316, and 318 includes a dielectric insulating substrate supporting one or more conductive portions (e.g., ground plane 120, power plane 130, signal traces 140 and 142, etc.) on the face of the layer 310, 312, 314, 316, or 318. Additionally, each layer 310, 312, 314, 316, and 318 may include conductive portions (e.g., edge pads 322, 324, or 330) on the edge of the layer 310, 312, 314, 316, or 318. The conductive portions may be patterned through additive techniques (e.g., chemical deposition) or subtractive techniques (e.g., masked etching).

In one example, the multi-layer substrate 110 may include more than five layers (e.g., layers 310, 312, 314, 316, and 318), more than one power shape (e.g., power shape 130), more than two ground planes (e.g., ground planes 120 and 320), and more than one layer of signal traces (e.g., signal traces 140 and 142).

In another example, the edge pads 322, 324, and 330 may extend for different lengths along the edge of the multi-layer substrate 110. For instance, the power edge pad 330 may extend only around the power layer 314, and the ground edge pads extend from the ground layer 312 to the ground layer 316, including the power layer 314 to provide shielding and isolation to the power plane 130. The ground planes 120 and 320 may serve as a return path for current supplied by the power shape 130 in addition to providing shielding and isolation. By interdigitating the power edge pad 330 with the ground edge pads 322 and 324, a connection analogous to a coaxial configuration confines noise from the power supply (e.g., switching noise) to the power plane and prevents noise from radiating outside the structure.

In a further example, a power edge pad may extend over multiple layers to connect power shapes on different layers. Ground edge pads may connect to ground planes surrounding the power shapes on multiple layers and extend to shield and isolate all of the power shapes from interference and noise.

Figure 4:
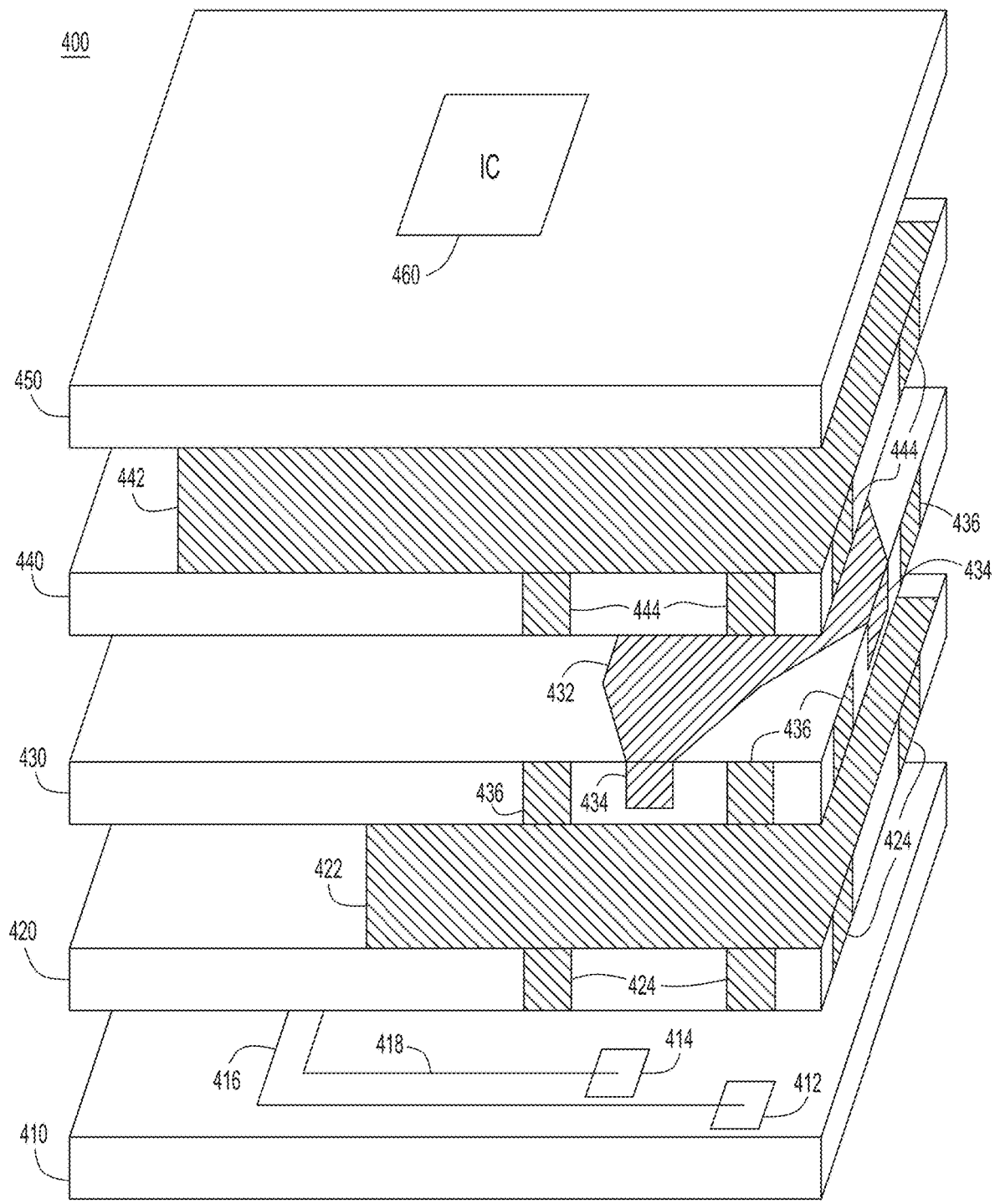
FIG. 4 is an exploded view of layers in a multi-layer substrate supporting an integrated circuit, according to an example embodiment.

Referring now to FIG. 4, an exploded view of a packaged device 400 is shown. The bottom layer 410 of the device 400 includes bottom contact vias 412 and 414 that connect to signal traces 416 and 418, respectively. The bottom contact vias 412 and 414 connect to bottom contacts (not shown) on the bottom face of the bottom layer 410. Above the bottom layer 410, a ground layer 420 supports a ground plane 422 that is configured to hold a voltage potential (e.g., ground or common) across a portion of the top face of the ground layer 420. Ground pads 424 along the edge of the ground layer 420 provide an external contact to maintain the ground plane 422 at the correct voltage level.

Above the ground layer 420, a power layer 430 supports a power shape 432 on the top face of the power layer 430. The power shape 432 is configured to maintain a relatively constant voltage differential (e.g., 3 V, 5 V, 12 V, etc.) from the ground voltage level maintained at the ground plane 422. Edge pads 434 along the edge of the power layer 430 provide an external contact to maintain the power shape 432 at the designed voltage level. Edge pads 436 are positioned along the edge of the layer 430 to substantially align with ground pads 424 on layer 420. The edge pads 436 are electrically connected to the ground pads 424 and electrically isolated from the power shape 432 and the edge pads 434.

Above the power layer 430, another ground layer 440 supports a ground plane 442 that is configured to hold the same voltage potential as the ground plane 422 on the ground layer 420. Ground pads 444 along the edge of the ground layer 440 provide an external contact to maintain the ground plane 442 at the correct voltage level. The ground pads 444 are also positioned along the edge of the ground layer 440 to substantially align with the edge pads 436 on the power layer 430 and the ground pads 424 on the ground layer 420. The combination of the grounds pads 424 and 444 connected by the edge pads 436 provide an electrical connection between the two ground planes 422 and 442. In one example, the ground pads 424, edge pads 436, and ground pads 444 may be fabricated as a single vertical edge pad than spans the layers 420, 430, and 440.

Above the ground layer 440, the top layer 450 supports an IC 460 (e.g., an optoelectronic chip). The IC 460 may be connected to the ground plane 442, the power shape 432, and the signal traces 416 and 418 through vias in the layers (e.g., layers 420, 430, 440, and 450) of the packaged device 400.

In one example, the ground planes 422 and 442 may occupy a substantial portion of the respective ground layers 420 and 440 with anti-pads in the ground planes 422 and 442 providing electrical isolation for signal and/or power lines that traverse through the substrates of the respective layers 420 and 440. Alternatively, the ground planes 422 and 442 may cover a smaller portion of the face of the respective substrates, allowing space for at least some of the signal/power lines to traverse the substrates outside of the bounds of the ground planes 422 and 442.

Figure 5:
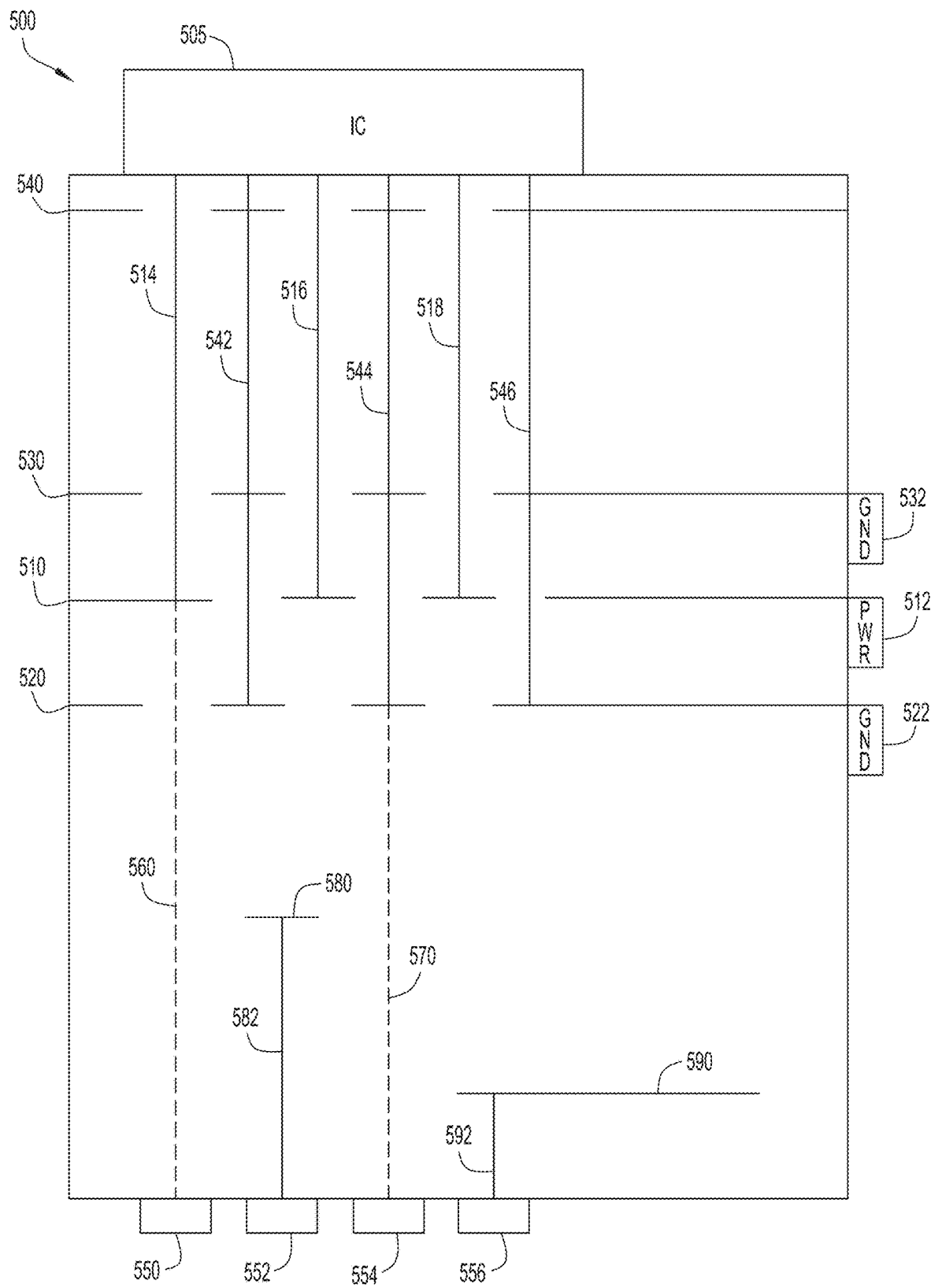
FIG. 5 is a simplified side view of a multi-layer substrate with multiple edge contacts connected to multiple power/ground planes, according to an example embodiment.

Referring now to FIG. 5, a simplified representation of a side view through a multi-layer substrate 500 illustrates the conductive paths to supply power to an IC 505 supported by the multi-layer substrate 500. The multi-layer substrate 500 includes a power plane 510 that is connected to a power pad 512 on the edge of the multi-layer substrate 500. The power plane 510 is connected to the IC 505 through power vias 514, 516, and 518.

The multi-layer substrate 500 includes a ground plane 520 below the power plane 510. The ground plane 520 is connected to a ground pad 522 on the edge of the multi-layer substrate 500. Similarly, the multi-layer substrate 500 includes a ground plane 530 above the power plane 510. The ground plane 530 is connected to a ground pad 532 on the edge of the multi-layer substrate 500. The ground planes 520 and 530 are configured to surround the power plane 510 and mitigate electrical noise emanating from the changing power needs of the IC 505.

Another ground plane 540 is disposed near the top of the multi-layer substrate 500 and acts to further isolate the IC 505 from noise and interference generated within the multi-layer substrate 500. The IC 505 may be connected to the ground planes 520, 530, and 540 through each of the vias 542, 544, and 546.

Bottom contacts 550, 552, 554, and 556 are disposed along the bottom face of the multi-layer substrate 500 and provide electrical contacts through vias in one or more of the layers of the multi-layer substrate 500. The bottom contact 550 provide an optional additional source of power for the power plane 510 through the via 560. Similarly, the bottom contact 554 provides a optional ground connection for the ground plane 520 through the via 570. The bottom contact 552 provides a connection to a signal trace 580 through a via 582. Similarly, the bottom contact 556 provides a connection to a signal trace 590 through a via 592.

In one example, the optional vias 560 and 570 are omitted due to the higher inductance of supplying power to the power plane 510 through the vias 560 and 570 relative to the inductance of supplying power to the power plane 510 through the power pad 512 on the edge of the multi-layer substrate 500. In one example, for an IC 505 that draws a large amount of power, the multi-layer substrate 500 requires significantly more power/ground vias (e.g., vias 560 and 570) than the number of power pads 512, increasing the inductance of supplying power to the IC 505 through the bottom contacts (e.g., bottom contacts 550 and 554) in comparison to the inductance of supplying power to the IC 505 through the relatively fewer number of edge pads (e.g., power pads 512). Due to the relatively larger surface area available for edge pads in comparison to vias, which translates into larger current densities for the edge pads, the inductance of supplying power to the power plane 510 through the power pads 512 is significantly smaller than the inductance of supplying power through the via 560.

Figure 6:
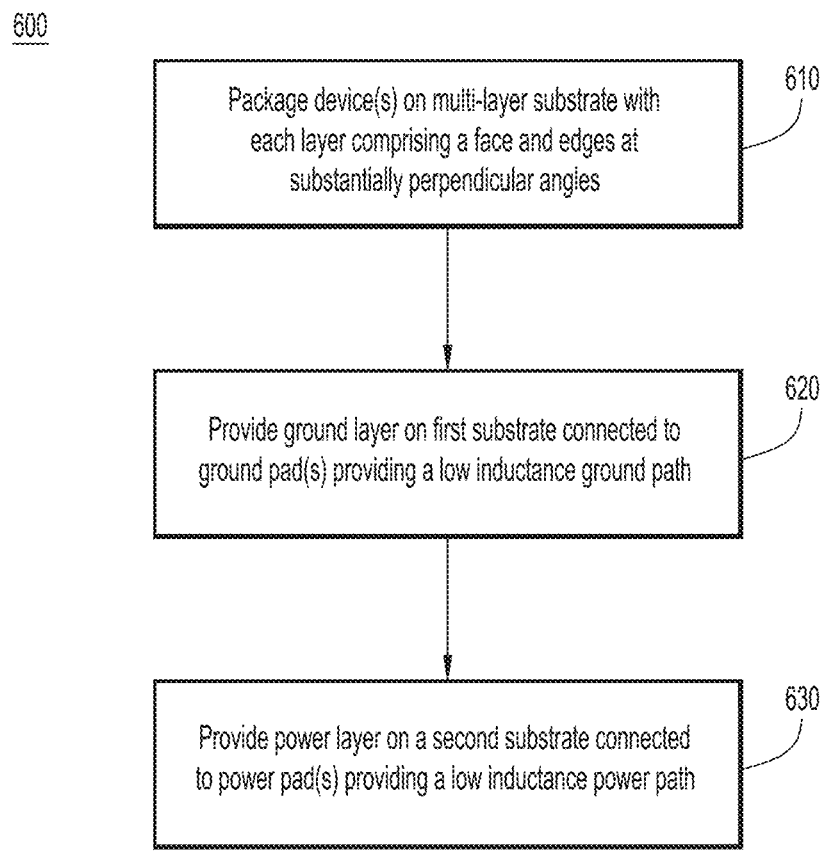
FIG. 6 is a flowchart illustrating operations performed at a multi-layer substrate to provide electrical power through edge contacts, according to an example embodiment.

Referring now to FIG. 6, a flowchart illustrates an example process 600 performed to supply power and ground connections to a high power electronic device (e.g., IC 112). At 610, one or more devices are packaged on a multi-layer substrate. The multi-layer substrate comprises a plurality of insulating substrate layers. Each substrate layer comprising a face supporting conductive traces and edges surround the face at a substantially perpendicular angle. In one example, each substrate layer is a PCB and the top substrate layer supports the one or more devices. In another example, additional electronic modules (e.g., voltage regulation modules) may also be supported by the multi-layer substrate. In a further example, the one or more devices may include optical devices, electronic devices, and/or optoelectronic devices.

At 620, a ground layer is provided on a first substrate of the plurality of insulating substrates. The ground layer is connected to at least one ground pad disposed on a first edge of the first substrate. The ground pad(s) provide a low inductance ground path from outside the multi-layer substrate to the ground layer. In one example, the conductive path from the ground pad(s) to the ground layer has an inductance that is negligible in comparison to a conductive path through the multi-layer substrate to bottom contacts on the bottom face of the multi-layer substrate. In another example, the ground layer covers a majority of the face of the first substrate and is connected to a plurality of ground pads spaced around the edges of the first substrate.

At 630, a power layer is provided on a second substrate of the plurality of insulating substrates. The power layer is connected to at least one power pad disposed on a second edge of the second substrate. The power pad(s) provide a low inductance power path from outside the multi-layer substrate to the power layer. In one example, the conductive path from the power pad(s) to the power layer has an inductance that is negligible in comparison to a conductive path through the multi-layer substrate to bottom contacts on the bottom face of the multi-layer substrate. In another example, the power layer may be connected to the one or more optical devices by vias that travel through the first layer and the ground layer. The power vias from the power layer to the device(s) may be insulated from the ground layer by antipads in the ground layer providing an insulating buffer around the power vias.

Variations and Implementations

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

In summary, the techniques presented herein provide large amounts of current to power planes through edge pads to support next generation chip power consumption needs. The thickness of the edge plating and the width of the edge pads determines the current density, and are not subject to the same design constraints as vias through the multi-layer substrate. With edge delivery, the current density may be higher than power delivery through vias to bottom contacts. In the case of NPO devices, over 200 traditional power vias may be replaced by only 35 edge pads.

With regard to a power delivery network for the supported chip, using edge-plated pads connected directly to the power plane may eliminate the need for vias in the multi-layer substrate. By reducing or eliminating the use of power and ground vias through the bottom layers of a multi-layer substrate, the edge pads provide low inductance paths to the power/ground planes in the multi-layer substrate. By shielding the power layer with one or more ground layers, the techniques presented herein mitigate external noise injected through the input power from reaching the other layers (e.g., the signal layers).

Additionally, preserving the layers below the power plane for signal routing improves the power integrity and mitigates a source of interference through the mutual inductance between power delivery vias and data signal traces, especially in the mid-high frequency ranges. The self-inductance of traditional power vias presents additional power integrity issues, which are eliminated by connecting the power plane to the edge pads. The edge pads improve signal and power integrity by eliminating the "Swiss Cheese phenomenon" of multiple holes through the underlying layers of the multi-layer substrate.

Further, by eliminating the power vias on the bottom of the multi-layer substrate and moving the power contacts to the edges, the overall footprint of the substrate may be reduced, lowering the cost of the device. The reduction in space needed for traditional power vias may also be used to facilitate larger board-to-board connectors.

In some aspects, the techniques described herein relate to an apparatus including: a plurality of insulating substrates stacked into a multi-layer substrate, each substrate including a face supporting conductive traces and edges surrounding the face at a substantially perpendicular angle; a ground plane on a first substrate of the plurality of insulating substrates, the ground plane connected to at least one ground pad disposed on a first edge of the first substrate, wherein the at least one ground pad provides a low inductance ground path to the ground plane; and a power plane on a second substrate of the plurality of insulating substrates, the power plane connected to at least one power pad disposed on a second edge of the second substrate, wherein the at least one power pad provides a low inductance power path to the power plane.

In some aspects, the techniques described herein relate to an apparatus, further including: a set of bottom contacts disposed on a bottom face of the multi-layer substrate; and one or more signal traces on a third insulating substrate of the plurality of insulating substrates disposed between the bottom face of the multi-layer substrate and the first substrate, the one or more signal traces connected to a one or more signal contact among the set of bottom contacts.

In some aspects, the techniques described herein relate to an apparatus, wherein the set of bottom contacts includes one or more ground contacts that are connected to the ground plane through a higher inductance ground path than the low inductance ground path provided by the at least one ground pad.

In some aspects, the techniques described herein relate to an apparatus, wherein the set of bottom contacts includes one or more power contacts that are connected to the power plane through a higher inductance power path than the low inductance power path provided by the at least one power pad.

In some aspects, the techniques described herein relate to an apparatus, wherein the at least one power pad is interdigitated with a plurality of ground pads on a side face of the multi-layer substrate, the side face of the multi-layer substrate including the first edge of the first substrate and the second edge of the second substrate.

In some aspects, the techniques described herein relate to an apparatus, wherein the at least one ground pad is disposed on the first edge of the first substrate and the second edge of the second substrate.

In some aspects, the techniques described herein relate to an apparatus, further including another ground plane on a third substrate of the plurality of insulating substrates, the second substrate with the power plane disposed between the first substrate and the third substrate.

In some aspects, the techniques described herein relate to an system including: at least one device configured to transmit or receive signals; and a multi-layer substrate packaged with the at least one device, the multi-layer substrate including a plurality of insulating substrates, each substrate including a face supporting conductive traces and edges surrounding the face at a substantially perpendicular angle; a ground plane on a first substrate of the plurality of insulating substrates, the ground plane connected to at least one ground pad disposed on a first edge of the first substrate, wherein the at least one ground pad provides a low inductance ground path to the ground plane; and a power plane on a second substrate of the plurality of insulating substrates, the power plane connected to at least one power pad disposed on a second edge of the second substrate, wherein the at least one power pad provides a low inductance power path to the power plane.

In some aspects, the techniques described herein relate to a system, further including: a set of bottom contacts disposed on a bottom face of the multi-layer substrate; and one or more signal traces on a third insulating substrate of the plurality of insulating substrates disposed between the bottom face of the multi-layer substrate and the first substrate, the one or more signal traces connecting a one or more signal contact among the set of bottom contacts to the at least one optical device.

In some aspects, the techniques described herein relate to a system, wherein the set of bottom contacts includes one or more ground contacts that are connected to the ground plane through a higher inductance ground path than the low inductance ground path provided by the at least one ground pad.

In some aspects, the techniques described herein relate to a system, wherein the set of bottom contacts includes one or more power contacts that are connected to the power plane through a higher inductance power path than the low inductance power path provided by the at least one power pad.

In some aspects, the techniques described herein relate to a system, wherein the at least one power pad is interdigitated with a plurality of ground pads on a side face of the multi-layer substrate, the side face of the multi-layer substrate including the first edge of the first substrate and the second edge of the second substrate.

In some aspects, the techniques described herein relate to a system, wherein the at least one ground pad is disposed on the first edge of the first substrate and the second edge of the second substrate.

In some aspects, the techniques described herein relate to a system, further including another ground plane on a third substrate of the plurality of insulating substrates, the second substrate with the power plane disposed between the first substrate and the third substrate.

In some aspects, the techniques described herein relate to a method including: packaging one or more devices packaged on a multi-layer substrate, the multi-layer substrate including a plurality of insulating substrates, wherein each substrate includes a face supporting conductive traces and edges surrounding the face at a substantially perpendicular angle; providing a ground plane on a first substrate of the plurality of insulating substrates, the ground plane connected to at least one ground pad disposed on a first edge of the first substrate, wherein the at least one ground pad provides a low inductance ground path to the ground plane; and providing a power plane on a second substrate of the plurality of insulating substrates, the power plane connected to at least one power pad disposed on a second edge of the second substrate, wherein the at least one power pad provides a low inductance power path to the power plane.

In some aspects, the techniques described herein relate to a method, further including: providing a set of bottom contacts disposed on a bottom face of the multi-layer substrate; and forming one or more signal traces on a third insulating substrate of the plurality of insulating substrates disposed between the bottom face of the multi-layer substrate and the first substrate, the one or more signal traces connected to a one or more signal contact among the set of bottom contacts.

In some aspects, the techniques described herein relate to a method, further including connecting one or more ground contacts in the set of bottom contacts to the ground plane through a higher inductance ground path than the low inductance ground path provided by the at least one ground pad.

In some aspects, the techniques described herein relate to a method, further including connecting one or more power contacts in the set of bottom contacts to the power plane through a higher inductance power path than the low inductance power path provided by the at least one power pad.

In some aspects, the techniques described herein relate to a method, further including interdigitating the at least one power pad with a plurality of ground pads on a side face of the multi-layer substrate, the side face of the multi-layer substrate including the first edge of the first substrate and the second edge of the second substrate.

In some aspects, the techniques described herein relate to a method, further including providing the at least one ground pad on the first edge of the first substrate and the second edge of the second substrate.

Each example embodiment disclosed herein has been included to present one or more different features. However, all disclosed example embodiments are designed to work together as part of a single larger system or method. The disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
    a plurality of insulating layers stacked into a multi-layer substrate, each layer comprising a face supporting conductive traces and edges surrounding the face at a substantially perpendicular angle;
    a ground plane on a first layer of the plurality of insulating layers, the ground plane connected to at least one ground pad disposed on a first edge of the first layer and connected to at least one additional ground pad disposed on a second edge of a second layer of the plurality of insulating layers, wherein each of the at least one ground pad and the at least one additional ground pad provides a low inductance ground path to the ground plane; and
    a power plane on the second layer of the plurality of insulating layers, the power plane connected to at least one power pad disposed on the second edge of the second layer, wherein the at least one power pad provides a low inductance power path to the power plane, and wherein the at least one additional ground pad is electrically isolated from the power plane on the second layer.

2. The apparatus of claim 1, further comprising:
    a set of bottom contacts disposed on a bottom face of the multi-layer substrate; and
    one or more signal traces on a third layer of the plurality of insulating layers disposed between the bottom face of the multi-layer substrate and the first layer, the one or more signal traces connected to one or more signal contacts in the set of bottom contacts.

3. The apparatus of claim 2, wherein the set of bottom contacts includes one or more ground contacts that are connected to the ground plane through a higher inductance ground path than the low inductance ground path provided by the at least one ground pad and the at least one additional ground pad.

4. The apparatus of claim 2, wherein the set of bottom contacts includes one or more power contacts that are connected to the power plane through a higher inductance power path than the low inductance power path provided by the at least one power pad.

5. The apparatus of claim 1, wherein the at least one power pad is interdigitated with the at least one additional ground pad at the second edge of the second layer of the plurality of insulating layers.

6. The apparatus of claim 1, wherein the at least one ground pad disposed on the first edge of the first layer is connected to the at least one additional ground pad disposed on the second edge of the second layer.

7. The apparatus of claim 1, further comprising another ground plane on a third layer of the plurality of insulating layers, the second layer with the power plane disposed between the first layer and the third layer.

8. A system comprising:
    at least one device configured to transmit or receive signals;
    a multi-layer substrate packaged with the at least one device, the multi-layer substrate comprising a plurality of insulating layers, each layer comprising a face supporting conductive traces and edges surrounding the face at a substantially perpendicular angle;
    a ground plane on a first layer of the plurality of insulating layers, the ground plane connected to at least one ground pad disposed on a first edge of the first layer, wherein the at least one ground pad provides a low inductance ground path to the ground plane;
    a power plane on a second layer of the plurality of insulating layers, the power plane connected to at least one power pad disposed on a second edge of the second layer, wherein the at least one power pad provides a low inductance power path to the power plane;
    a contact disposed on an outer face of an outer layer of the multi-layer substrate to provide a ground connection; and
    a via structure extending through the first layer and the second layer to the outer layer to electrically connect the ground plane to the contact, wherein the via structure is electrically isolated from the at least one power pad.

9. The system of claim 8, further comprising:
one or more signal traces on a third layer of the plurality of insulating layers disposed between the outer face of the multi-layer substrate and the first layer, the one or more signal traces connecting the contact to the at least one device.

10. The system of claim 9, wherein the via structure includes a higher inductance ground path than the low inductance ground path provided by the at least one ground pad.

11. The system of claim 9, comprising one or more power contacts that are connected to the power plane through a higher inductance power path than the low inductance power path provided by the at least one power pad.

12. The system of claim 8, wherein the at least one power pad is interdigitated with a plurality of ground pads on a side face of the multi-layer substrate, the side face of the multi-layer substrate including the first edge of the first layer and the second edge of the second layer.

13. The system of claim 8, wherein the at least one ground pad is disposed on the first edge of the first layer and the second edge of the second layer.

14. The system of claim 8, further comprising another ground plane on a third layer of the plurality of insulating layers, the second layer with the power plane disposed between the first layer and the third layer.

15. A method comprising:
packaging one or more devices on a multi-layer substrate, the multi-layer substrate comprising a plurality of insulating layers, wherein each layer comprises a face supporting conductive traces and edges surrounding the face at a substantially perpendicular angle;
providing a ground plane on a first layer of the plurality of insulating layers, the ground plane connected to at least one ground pad disposed on a first edge of the first layer, wherein the at least one ground pad provides a low inductance ground path to the ground plane;
providing a power plane on a second layer of the plurality of insulating layers, the power plane connected to at least one power pad disposed on a second edge of the second layer, wherein the at least one power pad provides a low inductance power path to the power plane; and
providing an additional ground pad disposed on the second edge of the second layer, wherein the additional ground pad is electrically isolated from the power plane on the second layer and is electrically connected to the at least one ground pad disposed on the first edge of the first layer.

16. The method of claim 15, further comprising:
providing a set of bottom contacts disposed on a bottom face of the multi-layer substrate; and
forming one or more signal traces on a third layer of the plurality of insulating layers disposed between the bottom face of the multi-layer substrate and the first layer, the one or more signal traces connected to one or more signal contacts in the set of bottom contacts.

17. The method of claim 16, further comprising connecting one or more ground contacts in the set of bottom contacts to the ground plane through a higher inductance ground path than the low inductance ground path provided by the at least one ground pad.

18. The method of claim 16, further comprising connecting one or more power contacts in the set of bottom contacts to the power plane through a higher inductance power path than the low inductance power path provided by the at least one power pad.

19. The method of claim 15, further comprising interdigitating the at least one power pad with the additional ground pad disposed on the second edge of the second layer of the plurality of insulating layers.

20. The method of claim 15, further comprising providing the at least one ground pad on the first edge of the first layer and the second edge of the second layer.

\* \* \* \* \*